(12) United States Patent
Myers

(10) Patent No.: US 7,429,521 B2
(45) Date of Patent: Sep. 30, 2008

(54) CAPILLARY UNDERFILL OF STACKED WAFERS

(75) Inventor: Preston T. Myers, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 296 days.

(21) Appl. No.: 11/396,044

(22) Filed: Mar. 30, 2006

(65) Prior Publication Data

US 2007/0231965 A1 Oct. 4, 2007

(51) Int. Cl.
*H01L 21/30* (2006.01)

(52) U.S. Cl. .................... 438/455; 257/E21.122

(58) Field of Classification Search ......... 438/455–458; 257/E21.122

See application file for complete search history.

(56) References Cited

U.S. PATENT DOCUMENTS

| 6,093,577 | A  | * | 7/2000 | van der Groen et al. ....... 438/30 |
| 6,534,383 | B1 | * | 3/2003 | Iwane et al. ................. 438/458 |
| 6,967,412 | B2 |   | 11/2005 | Standing |
| 6,984,873 | B2 |   | 1/2006 | Kloster et al. |
| 7,042,076 | B2 | * | 5/2006 | Geosling ..................... 257/682 |

* cited by examiner

*Primary Examiner*—Brook Kebede
(74) *Attorney, Agent, or Firm*—Blakely, Sokoloff, Taylor & Zafman LLP

(57) ABSTRACT

A plurality of wafers are aligned and stacked on a thermally variable rotary table, the table and stack are rotated, and an underfill material is disposed and cured between wafers in the stack, bonding the wafers. Corresponding wafer portions of the plurality of wafers in the stack may be singulated from the stack, and may comprise semiconductor device packages either individually or when coupled with a substrate.

9 Claims, 10 Drawing Sheets

(a)

CAPILLARY UNDERFILL OF STACKED WAFERS

FIELD OF THE INVENTION

The invention relates generally to the field of semiconductor device manufacturing. In particular, the invention relates to stacked semiconductor device packages.

BACKGROUND OF THE INVENTION

As customer demand grows for smaller and more portable devices, size reduction becomes an increasingly important objective for electronic device manufacturers. Manufacturers continue to search for ways to pack more functionality and higher performance into small electronic devices. However, increasing functionality and performance frequently requires adding components into an electronic device, which can increase the device size. One approach is to combine numerous separate components or devices into a single component or package. With regard to semiconductor devices, this has taken several forms. On one hand, semiconductor device manufacturers may design more than one kind of semiconductor device onto a single 'chip', but this can grow the chip area, consuming more space on a substrate in the electronic device. On the other hand, semiconductor device manufacturers may stack numerous individual semiconductor chips into a single stack. Of these two approaches, the latter has the benefit of reducing the amount of surface area consumed on a substrate to which such a stacked semiconductor device package is attached.

To form the stack of individual chips, manufactures typically attach one chip (bottom chip) to a substrate, then attach each successively higher chip in the stack to the either the bottom chip, or to the chip last added to the stack. Alternately, chips may be attached to form a stack prior to attaching it to a substrate, with gaps existing between each of the chips in the stack.

The gaps between chips are filled with an underfill material to further bond the chips together to help prevent defects that may be caused by thermal stresses resulting from different coefficients of thermal expansion (CTE) between the chips in the stack. Typically, an underfill material is first deposited at the junction of the bottom chip and the substrate, and the underfill material is drawn beneath the chip by capillary action. A fillet of underfill material forms around the periphery of the chip, adhering to the substrate and to at least a portion of the outer edge of the chip. A second deposition of underfill material is disposed atop this fillet, and the underfill material is built up so that it contacts at least a portion of an edge of the bottom chip and a portion of an edge of the next higher (second) chip in the stack, therefore causing the underfill material to be drawn into and through the gap between the bottom chip and the second chip. A fillet forms around the periphery of the second chip, and the process described above is repeated again once for each gap between chips in the stack. Finally, a fillet is formed in contact with at least a portion of the uppermost chip in the stack. The combination of all the fillets formed during this process creates a single large fillet extending a substantial distance away from the periphery of the stack of chips, and in simultaneous contact with the surface of the substrate and with each and every chip in the stack of chips. Underfill material may be cured after each deposition, or it may all be cured in a single operation after all gaps in the stack are filled.

Numerous problems are inherent in this process. It requires a substantial amount of time to complete the iterative underfill application process and form a finished stack. The large underfill fillet typically extends a substantial distance away from the stacked chips, forming an 'overrun tongue' that consumes a notably larger amount of substrate surface area than is covered by the stack itself. This tongue prevents other components from being placed close to a chip stack, which can create both design, and as a result, performance problems. With regard to design problems, it forces other components to be placed more densely within the size constraints of a device design, or alternatively, may force the device size to be increased to accommodate the spatial inefficiencies of the large fillets. With regard to performance, some semiconductor devices perform less efficiently if the transmission lines from the device to associated components (e.g., capacitors) are too long. A large fillet may force capacitors to be placed onto a substrate far enough away from a device that device performance is negatively affected.

Further, a large amount of underfill material may be needed to not only fill the gaps, but to also form an increasingly high base for each subsequent deposition of underfill material. Nearly all of the underfill not filling the gaps between chips or between the bottom chip and the substrate surface, may be considered wasted material. Additionally, the large amount of underfill material requires a substantial amount of time to cure. Within the stack itself, the chips may not each be the same size, or the edges of the chips may not align with the corresponding edges of every other chip in the stack. Such non-aligned edges may create difficulties in chip handling, and may also negatively effect the efficiency of the underfill process. Further, as the underfill material migrates within the gaps between chips and outward to form the peripheral fillets, no alignment or uniform periphery is formed with regard to any chip in the stack related to any other chip in the stack, nor with regard to the underfill material related to any chip in the stack. Rather, an irregular, sloping periphery (fillet) is formed in most cases.

Another notable defect inherent in the method described above is void formation. Capillary underfill, migrating into and through a gap between adjacent chips, is known to migrate at different rates depending on the number of obstructions that may exist in its path, such as may be formed by an array of interconnections between two chips. In such cases, with capillary action alone pulling the underfill material through the gap, underfill material may migrate entirely around an array of interconnections before the gap within the array is filled. In these situations, a void of trapped air can remain in the center of the array completely surrounded by underfill material, and therefore, the interconnections within the array may not be adequately stabilized against CTE damage, and device failure may result.

Taken together, the above described problems associated with existing stacked chip solutions account for a substantial amount of yield reduction in semiconductor manufacturing operations, as well as cost and design inefficiencies.

DETAILED DESCRIPTION OF THE INVENTION

A wafer stack is formed from a base wafer and one or more other wafers superimposed upon the base wafer (superimposing wafers). The order of wafers in a wafer stack will correspond to the bonding order of the devices in a finished stacked chip device, so a bonding order will be determined, at 110 of FIG. 1, to identify which wafer will be the base wafer, and the order of each sequential superimposing wafer with respect to the base wafer.

Figure 1:
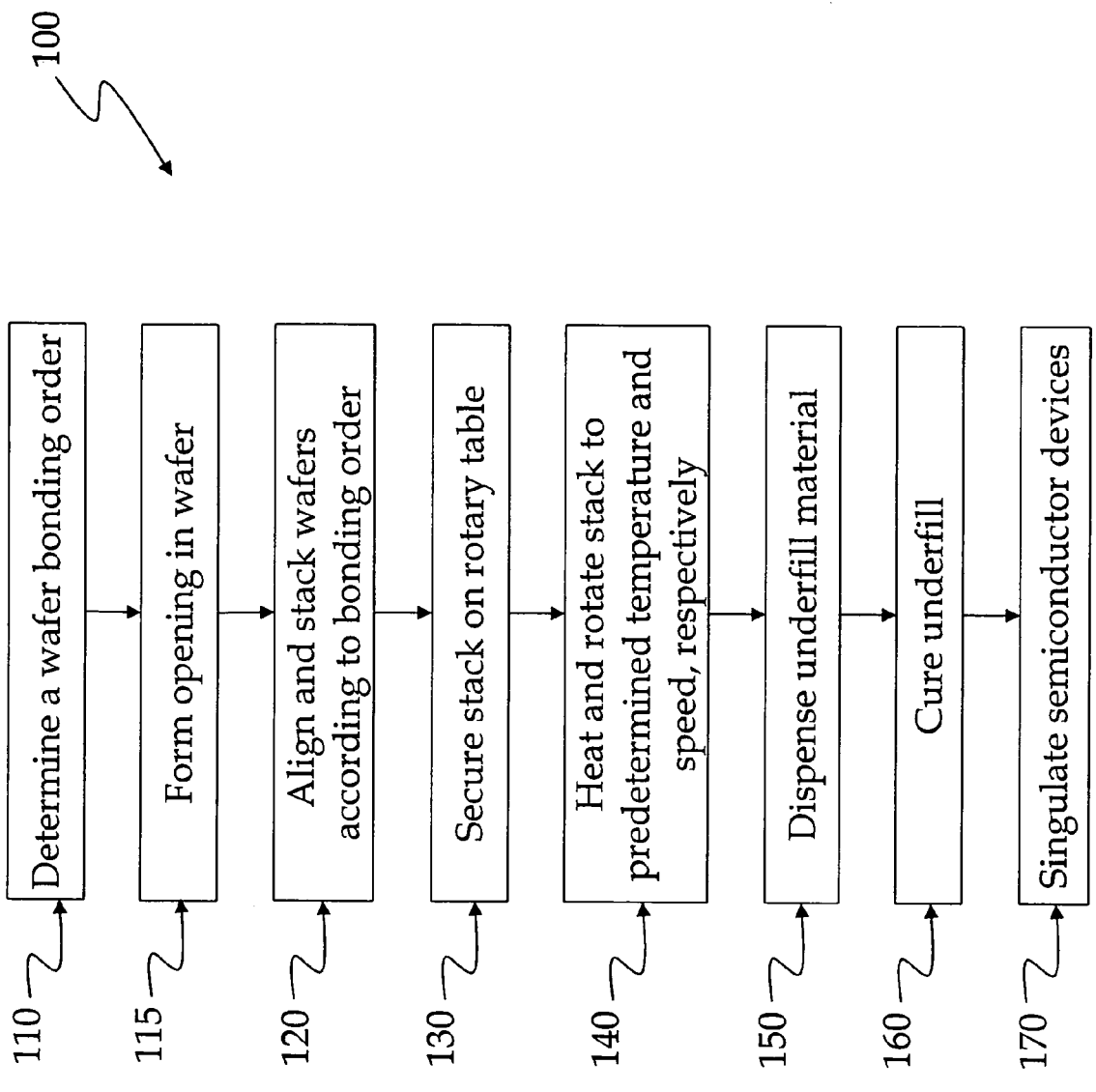
FIG. 1 depicts an embodiment of a method for forming a singulated stacked device package.
Figure 2:
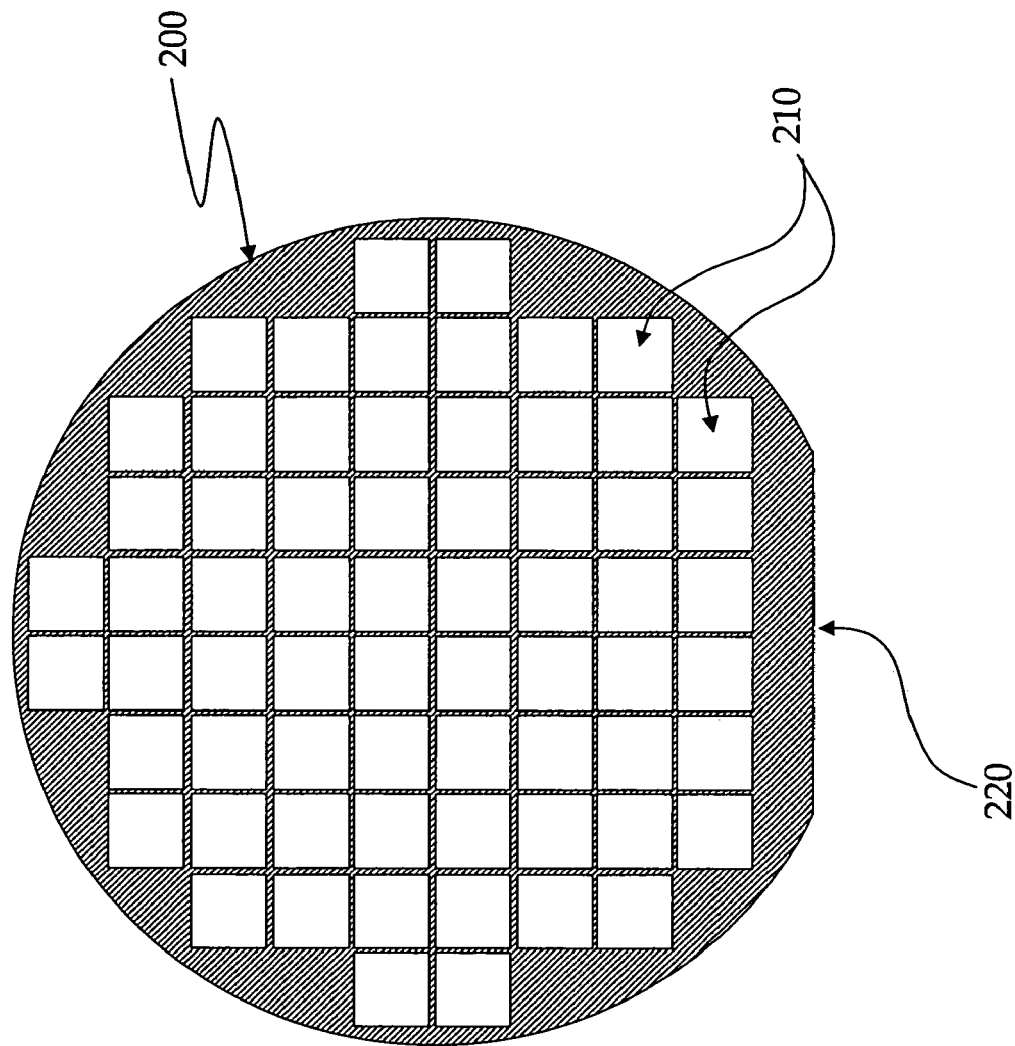
FIG. 2 depicts an embodiment of a wafer including a plurality of surface features.

In an embodiment of the invention, as shown in FIG. 1, a wafer (superimposing wafer) is aligned with and stacked, at 120, atop the base wafer. In embodiments, such as that shown in FIG. 2, a wafer 200 may have a plurality of semiconductor devices 210 (devices) formed at a surface. Aligning may include indexing a flat portion 220 (wafer flat) or a notch on the periphery of each wafer 200 so that each semiconductor device on a superimposing wafer is accurately registered to a corresponding semiconductor device on the base wafer 210, wherein the wafer flat 220 or the notch serve as reference points for alignment. In embodiments, a patterned feature (e.g., a fiducial, a device) at a surface of each wafer may provide a reference point for alignment rather than a notch or wafer flat 220. In embodiments, wafers in a stack may be oriented so a patterned surface of a wafer faces an unpatterned surface of another wafer, or a patterned surface of a wafer may face a patterned surface of another wafer in a wafer stack. In still other embodiments, an unpatterned surface of a wafer may face an unpatterned surface of another wafer in a wafer stack.

Figure 3:
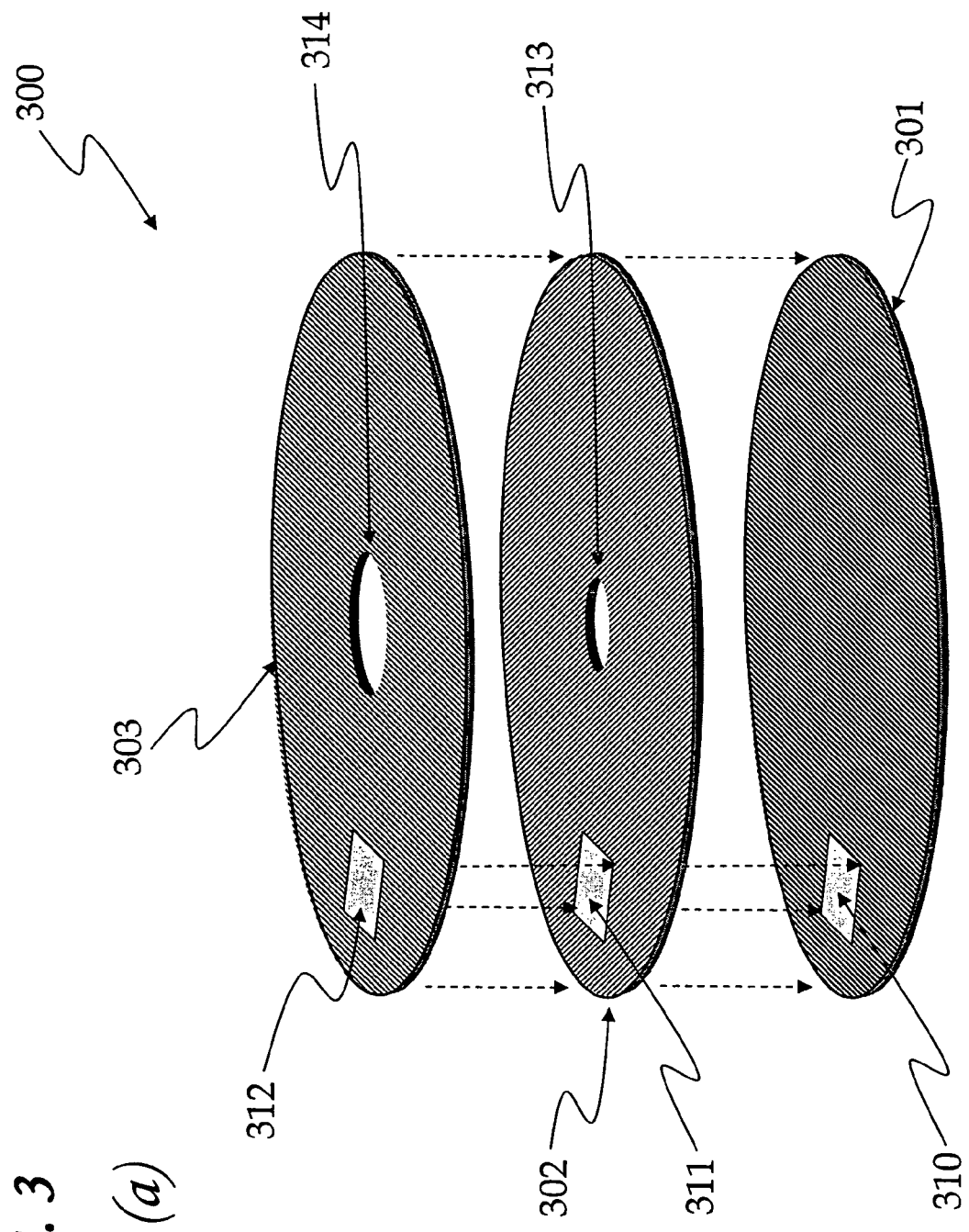
FIG. 3a depicts an oblique view of an embodiment including a base wafer and two superimposing wafers being substantially aligned prior to being stacked.
FIG. 3b depicts a cross-sectional view of an embodiment of a wafer stack.
FIG. 3c depicts a cross-sectional magnified view of an embodiment of a central portion of a wafer stack.
Figure 3:
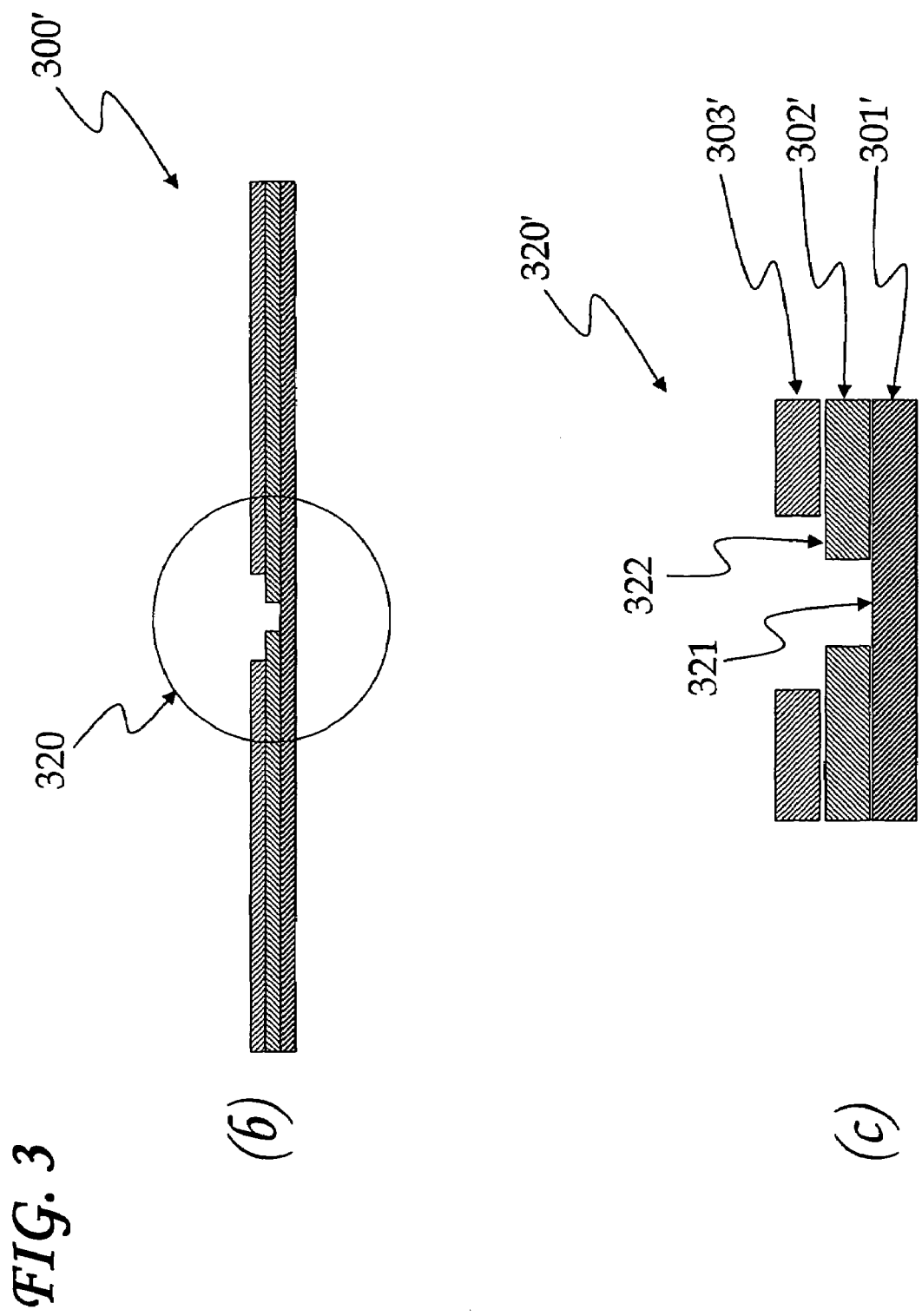

In an embodiment 300 as shown in FIG. 3a, a wafer stack may comprise a base wafer 301 and one or more superimposing wafers 302, 303. Wafers in the stack are aligned so that at least one device 310 on the base wafer 301 is registered to at least one corresponding device 311, 312 or other feature at the surface of each of the superimposing wafers 302, 303, such that the devices 310, 311, 312 or surface features may also act as reference points for alignment. For example, a wafer in the wafer stack may have one or more interconnect features formed at a surface rather than a semiconductor device, and the interconnect feature(s) then serve as a reference point for alignment. Alternatively, a wafer may not have features formed onto a surface at all, but is aligned using a physical feature at the periphery of the wafer, such as a notch or flat, or arbitrarily aligned.

According to embodiments, a centrally located opening (hole) 313, 314 is formed into each superimposing wafer 302, 303, as also shown in FIG. 1 at 115, extending through from a first surface of a wafer to a second, parallel surface of the wafer. Such hole may be circular to enhance uniform distribution of underfill material across a surface of a wafer, however, a non-circular hole may also be effectively employed when, for example, devices are distributed non-uniformly across a wafer and a non-uniform or directed flow of underfill material is intended. In an exemplary embodiment, an area of a wafer surface presents more obstruction to underfill distribution than another area of the wafer surface, and use of a non-circular hole provides an increased quantity of underfill material to the obstructed area to compensate for the obstruction, providing a more uniform overall distribution of underfill material at all areas of the wafer surface. This is because underfill material disposed at a surface of a rotating wafer through a non-circular hole in a conjoined, rotating, superimposing wafer will tend to accumulate proximate to a portion of the hole most distant from the rotational center of the hole due to centrifugal force.

A hole 313, 314 may be formed by laser etching, but may be formed by different methods. A similar hole will not typically be formed into a base wafer 301. In an embodiment including a base wafer and a single superimposing wafer, the hole in the superimposing wafer is formed large enough to allow an underfill material to be dispensed through the hole and onto the surface of the base wafer. In an embodiment including more than one superimposing wafer, the hole in each successive superimposing wafer is larger than the hole in the wafer directly beneath. For example, the hole 313 in the wafer 302 (first superimposing wafer) directly superimposing the base wafer 301 will be smaller than the hole 314 in the next superimposing wafer 303 (e.g., second superimposing wafer) in the stack. The smallest hole in a wafer of a wafer stack is formed to admit passage of a dispensing device with, for example, an outside diameter of 1.27 millimeters or less, into or through the hole. Generally, a minimum size for a hole in a wafer is that size which, however small, permits an underfill material to be dispensed though the hole and disposed at a surface of a wafer superimposed by the wafer having the hole.

In embodiments as shown in FIGS. 3a, 3b and 3c, when superimposing wafers 302', 303' are aligned in a stack 300', the holes in the superimposing wafers 302', 303' also align in the central portion 320, 320' of the wafer stack 300'. As a result of such alignment, a central portion of the surface 321 of the base wafer 301' will be exposed through the hole 313 of a superimposing wafer 302'. Likewise, in embodiments including more than one superimposing wafer 302', 303', a central portion of the upper bonding surface 322 of a superimposing wafer 302' will be exposed through the larger hole 314 of each subsequent superimposing wafer 303' in the stack 300'. The upper surface of a superimposed wafer is referred to as a 'bonding surface'. Likewise, the lower surface of a superimposing wafer is referred to as 'bonding surface'.

Throughout this description, the terms 'upper' and 'lower' are used to indicated an orientation of a wafer surface relative to a reference surface, such as the surface of a rotary table, not necessarily to indicate that a particular surface of a wafer, for example, the patterned side is actually the upper or lower surface. Rather, according to various embodiments, a patterned side of a wafer may be either the upper side, if it is oriented facing away from the surface of a rotary table, or it may be designated the 'lower' surface if facing toward the surface of a rotary table.

Figure 4:
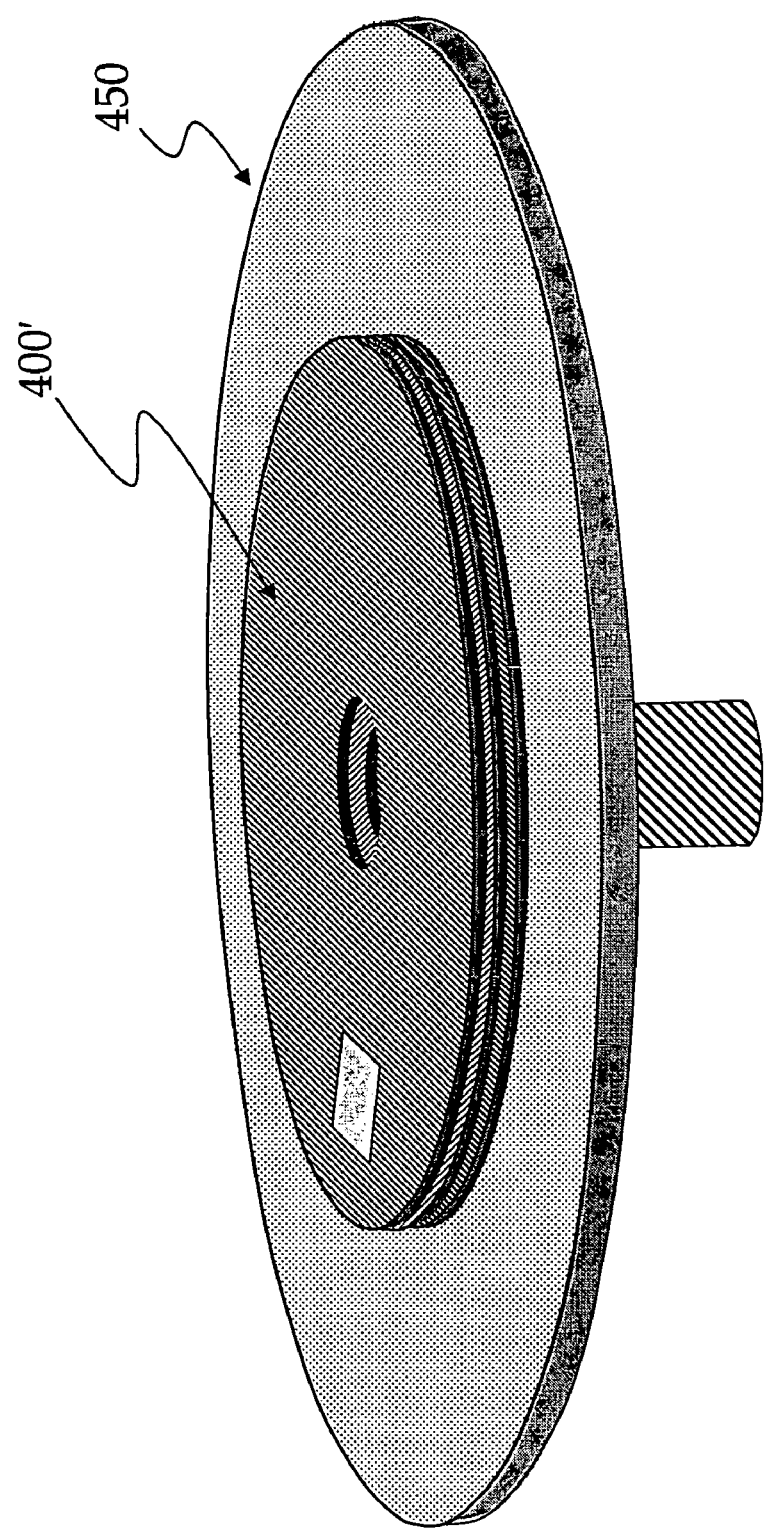
FIG. 4 depicts an oblique view of an embodiment including a wafer stack disposed on a rotary table.

In embodiments, such as that depicted in FIG. 1 at 130, and that depicted in FIG. 4, the aligned wafer stack 400' is secured to a surface of a rotary table ('table') 450. Securing a stack 400' with a table 450 may be achieved by the use of vacuum, mechanical devices, adhesives, or other methods as may be known in the art. Wafers in a stack are physically coupled with each other, such as by solder bumps of a controlled collapse chip connection (C4) device. Alternatively, wafers may be coupled with other wafers in the stack by adhesives, mechanical fasteners, or other means. In general, securing a base wafer with a rotary table has the effect of securing all wafers in the stack to the rotary table. The rotary table is heated, and/or configured to operate at variable speeds. The wafer stack 400' is heated, and the rotation speed of the table 400' is increased, as shown at 140 of FIG. 1. A predetermined minimum or maximum temperature, and/or a minimum or maximum speed of rotation is set, as well as other intermediate temperatures or rotational speeds. Additionally, the rate of increase or decrease, of either the temperature, speed or both, may also be set. In an exemplary embodiment, a temperature of 110° C. may be set as a minimum temperature at which an underfill material is to be dispensed, although different temperatures may be used as appropriate for the underfill material being used, as well as other factors. Likewise, a range of rotation speed may be set corresponding to dispensing an underfill material. One of ordinary skill in the art will understand that various parameters, such as speed and temperature, may correspond with each other, with particular operations (e.g., dispensing an underfill material), with other parameters (e.g., wafer diameter), or combinations of all or any subset of other parameters affecting formation of an underfilled wafer stack according to embodiments of the invention.

Figure 5:
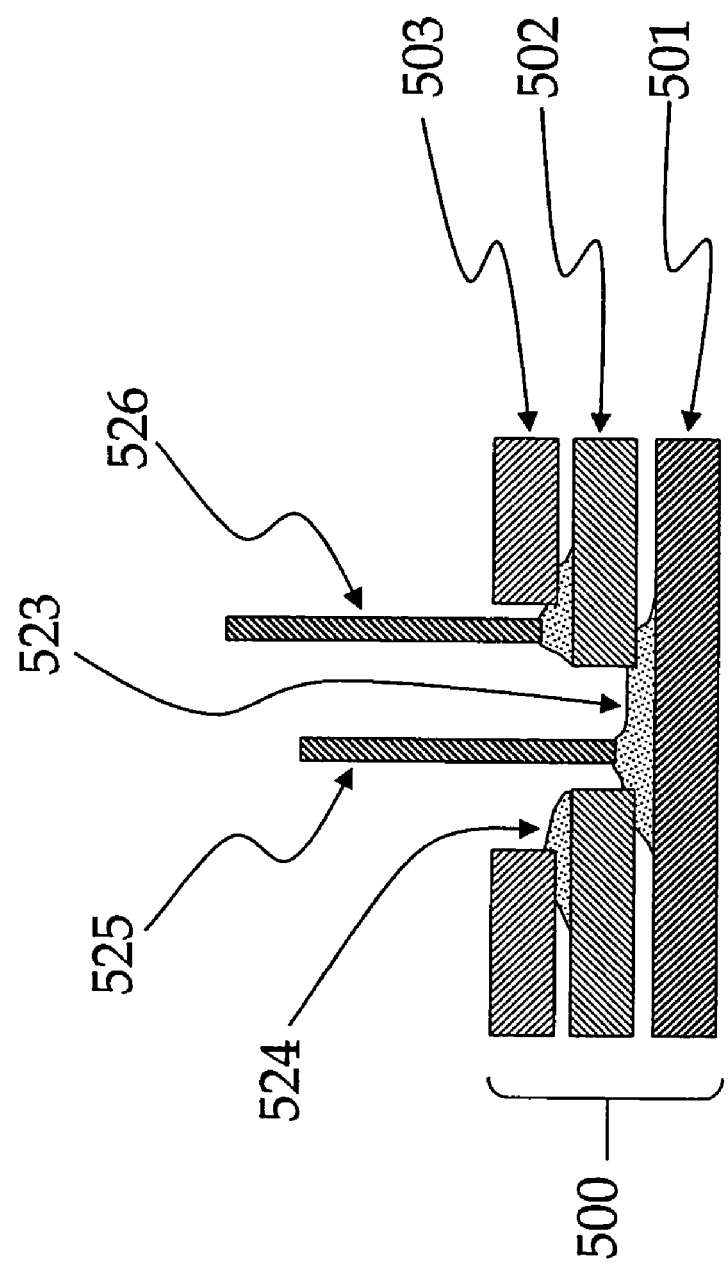
FIG. 5 depicts a cross-sectional magnified view of an embodiment of a central portion of a wafer stack wherein underfill material is being disposed.

In FIG. 1 at 150 and with reference to FIG. 5, while the stack 500 rotates, an underfill material 523 is dispensed through a hole in a superimposing wafer 502 and disposed at an exposed surface of the base wafer 501 by a dispensing device 525. The underfill material 523 may be dispensed onto a wafer surface while a table is rotating at a speed less than the predetermined maximum speed, but still increasing rotational speed to attain a predetermined maximum speed. After a sufficient amount of underfill 523 to substantially fill a gap between adjacent wafers is disposed at a surface of the base wafer 501, the dispensing device is repositioned at 526 and underfill material 524 is disposed adjacent to an exposed surface of a superimposing wafer 502 positioned above the base wafer 501 in stack 500. This process is repeated for each superimposing wafer in the stack until a sufficient amount of underfill is disposed at a surface of each wafer in the stack. In general, no underfill material is disposed at the exposed upper surface of an uppermost superimposing wafer 503. Capillary movement of a dispensed underfill material between and substantially covering the surfaces of stacked wafers involves numerous interacting variables, such as underfill material viscosity, dispense rate, speed and duration of rotation, wafer surface temperature and topography, and wafer size.

In alternate embodiments, multiple devices 525, 526 are configured to dispose underfill material 523, 524 onto a plurality of wafers 501, 502 or all wafers in a stack 500 simultaneously, or sequential dispense operations dispose underfill adjacent to bonding surfaces of the wafers in a stack. One can even dispense a sufficient amount of underfill material that the opening of some or all of the superimposing wafers in the stack remain filled with underfill material even after each gap between adjacent wafers in the stack is substantially filled with underfill material.

At least two forces act upon the disposed underfill material, causing it to move into a gap between bonding surfaces of adjacent wafers, distributing outward through the gap from the central portion of the wafers toward their periphery. One of these forces is centrifugal force, outwardly exerted upon the underfill material by the rotation of the wafers on a rotary table. The other force is capillary action, resulting from the surface tension of the underfill material in contact with the bonding surfaces of two adjacent wafers. Due to the presence of features etched or otherwise formed at the surfaces of wafers in the stack, the thickness of underfill material in a gap between adjacent wafers may vary corresponding to different locations within the gap. For this reason, the underfill material may not, in every embodiment, distribute with an even thickness in every portion of a gap between adjacent wafers. Further, underfill material may not spread from where it is disposed to the outer edge of a wafer at all points around the wafer's perimeter in every embodiment.

Figure 6:
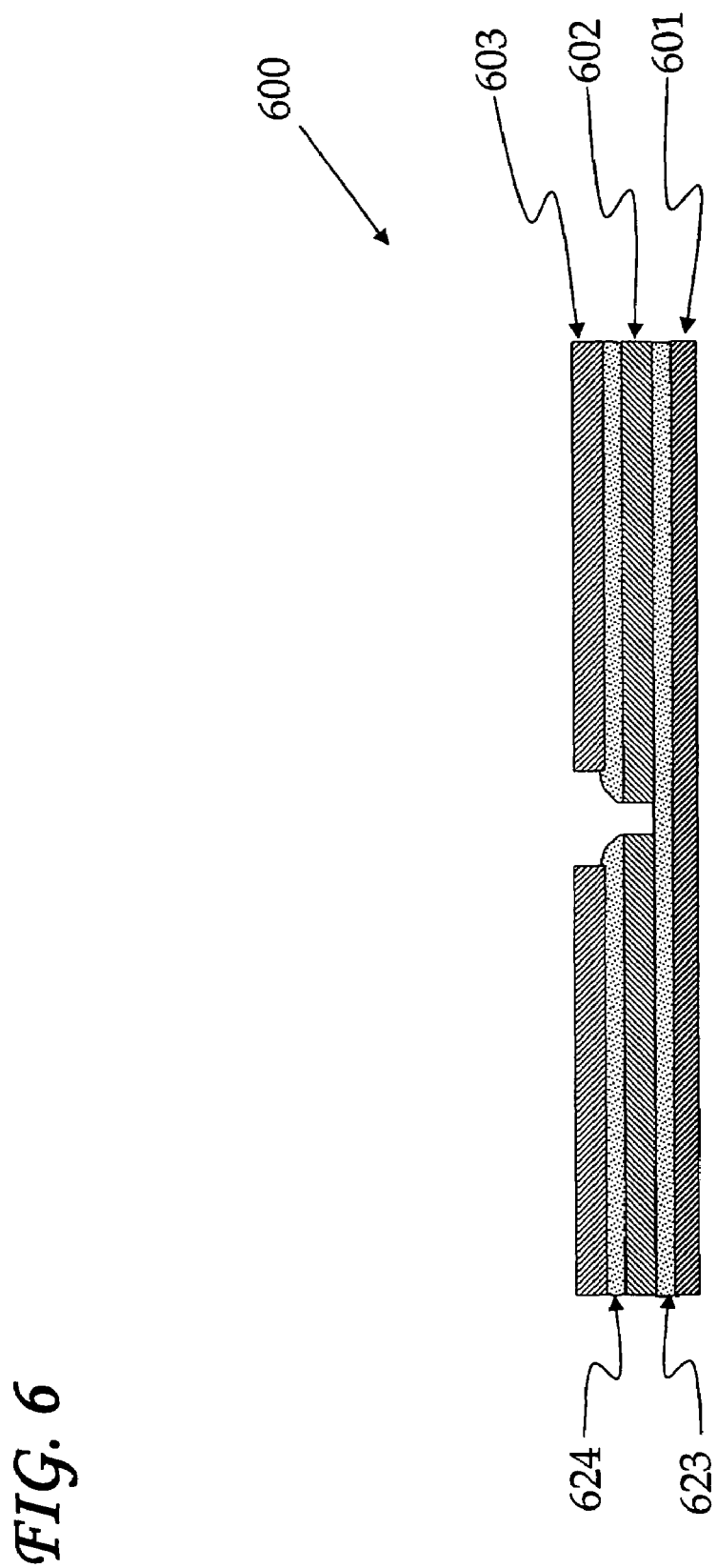
FIG. 6 depicts a cross-sectional view of an embodiment of a wafer stack wherein disposed underfill material is spread substantially to the outer perimeter of the wafer stack.

As shown in the embodiment of FIG. 6, a wafer stack 600 includes a plurality of wafers 601, 602, 603 and an underfill material 623, 624 in the gap or gaps formed between adjacent wafers in the wafer stack 600. In embodiments, the underfill material will be distributed in the gap from a location proximate to a hole in each wafer to a location at or proximate to the periphery of each wafer. The underfill material will also, in embodiments, be distributed across all or nearly all of the wafer surface area between the hole and the periphery of a wafer surface presented to an adjacent wafer surface in the wafer stack.

As underfill material within a gap between adjacent surfaces of wafers in a wafer stack distributes toward the outer edge of a wafer, the rotational speed of the table may be varied, the temperature of the rotary table, and thus the wafer stack, may be varied, or both the rotational speed and the temperature of the rotary table may be varied. Such changes in rotational speed and/or temperature provide the ability to regulate the rate of underfill material distribution. In an exemplary embodiment, the rotational speed of the table may be decreased as underfill material approaches an outer edge of a wafer in the stack, to slow the rate at which the underfill material outwardly distributes across the wafer. Any of numerous factors may influence the selection of rotational speeds and temperatures throughout dispensing and spreading an underfill material, such as wafer size, underfill material type, wafer surface topography, ambient environmental conditions, the size of a gap between adjacent wafers, and other factors.

When underfill material has been distributed sufficiently proximate to the outer edge of a wafer in a wafer stack, the underfill material is cured, as shown in FIG. 1 at 160. Curing may be accomplished thermally, by exposure to a radiation source, by maintaining in a vacuum environment, chemically, or by some other means or method as may be known in the art. For example, heating a wafer stack to 200° C. for a sufficient duration will cure an underfill material. Other cure temperatures may be used as appropriate considering a number of factors, such as underfill material type, volume, atmospheric pressure and others. Curing may take place while the wafer stack remains on the rotary table, or the wafer stack may be removed from the rotary stack and cured in a separate location, or possibly even at a later time. Once cured, an underfill material forms a bond between adjacent surfaces of adjacent wafers in a wafer stack, closely maintaining the position of each wafer in the stack relative to each other wafer in the stack. Therefore, each semiconductor device or feature at a surface of a wafer in the stack is fairly stably held in alignment with other corresponding semiconductor devices or wafer surface features in the stack. A bond formed by cured underfill may rigidly hold wafers in alignment, or it may allow some movement of wafers in the stack relative to other wafers in the stack, such as may occur due to different coefficients of thermal expansion.

Figure 7:
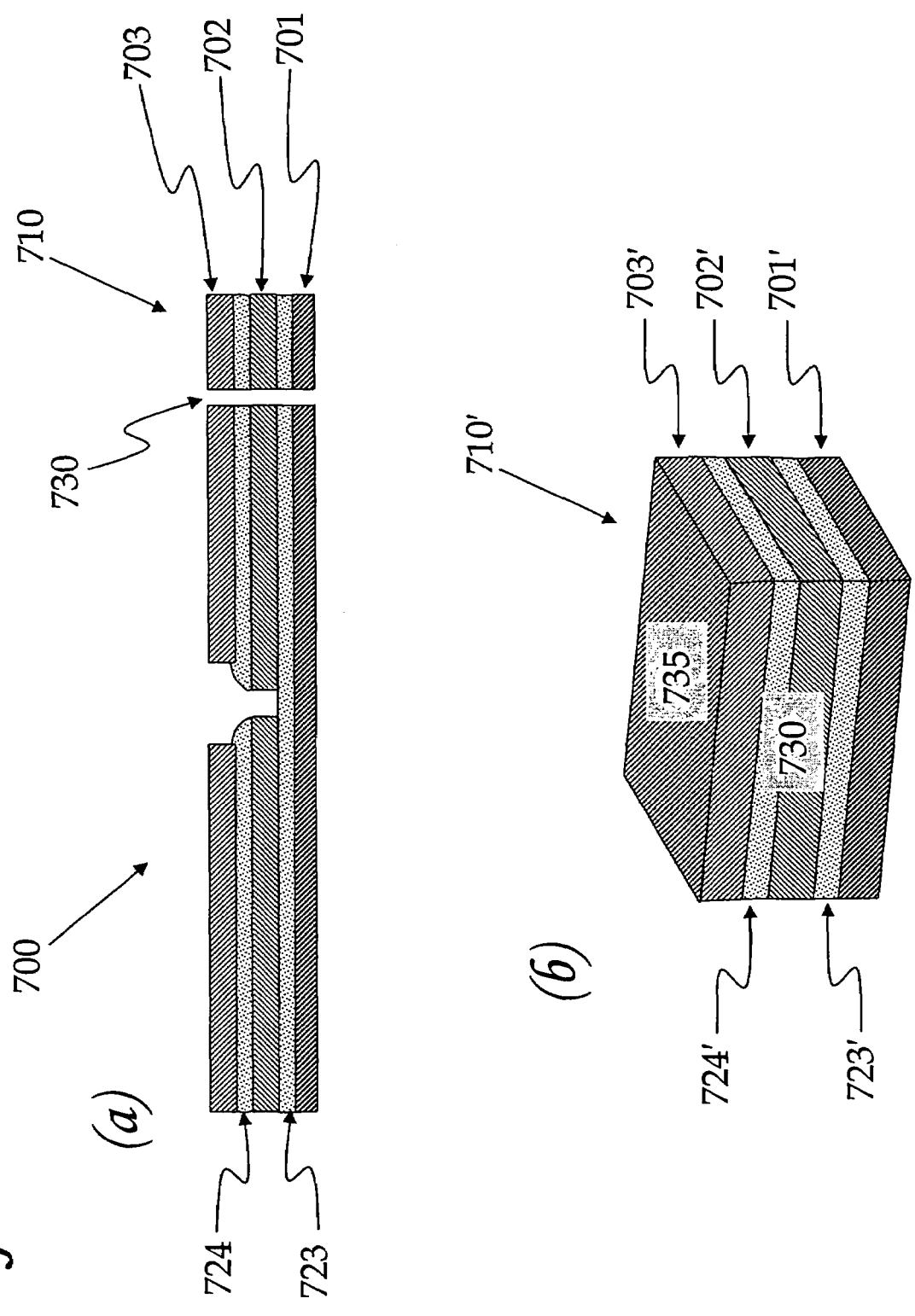
FIG. 7a depicts a cross-sectional view of an embodiment of a portion of a wafer stack including an embodiment of a singulated device stack.
FIG. 7b depicts an oblique cross-sectional view of an embodiment of a singulated semiconductor device stack.

As shown in FIG. 7a, once the underfill is cured and a substantially durable bond is formed between the underfill and adjacent wafers in the wafer stack 700, the wafer stack 700 is singulated, as at 170 of FIG. 1, to separate aligned 'device stacks' 710 of corresponding wafer portions 701, 702, 703 from other such aligned device stacks still integral with the wafer stack 700, as well as from wafer material and underfill material not corresponding to a device stack. A device stack 710 includes one or more wafer portions 701, 702, 703 with one or more semiconductor devices or other wafer surface features formed thereon. For example, a semiconductor device on a base wafer is aligned with and bonded to a corresponding semiconductor device on each superimposing wafer to form a semiconductor device stack (device stack) within the wafer stack. During singulation, a semiconductor device stack 710 is separated from the remainder of the wafer stack 700 at a boundary 730 defining the wafer portions of the device stack. Separation is accomplished by physically cutting the wafer (e.g., cutting with a laser, with a saw, etc.) along a boundary 730 at the periphery of each wafer portion 701, 702, 703 in the device stack 710, including separating the underfill material 723, 724.

In embodiments such as shown in FIG. 7b, a singulated semiconductor device stack 710' possesses a plurality of surfaces, including a surface of a wafer portion singulated from a base wafer (base portion), a surface 735 of a wafer portion singulated from an uppermost superimposing wafer (uppermost portion), and a plurality of singulated surfaces, such as 730, formed at the time of singulation, and including the exposed edges of the singulated wafer portions (base portion 701', and superimposing wafer portions 702', 703') and the underfill material 723', 724' in the stack 710'. As a result of the bonded semiconductor stack 710' being singulated as an integrated unit, in embodiments, exterior (singulated) surfaces 730 of a semiconductor device stack 710' are substantially planar across the edges of the wafer portions 701', 702', 703' and the underfill material 723', 724'. Likewise, surfaces of a semiconductor device stack 710' comprising the exposed surfaces of a base portion and an uppermost portion 735 may also be substantially planar.

Figure 8:
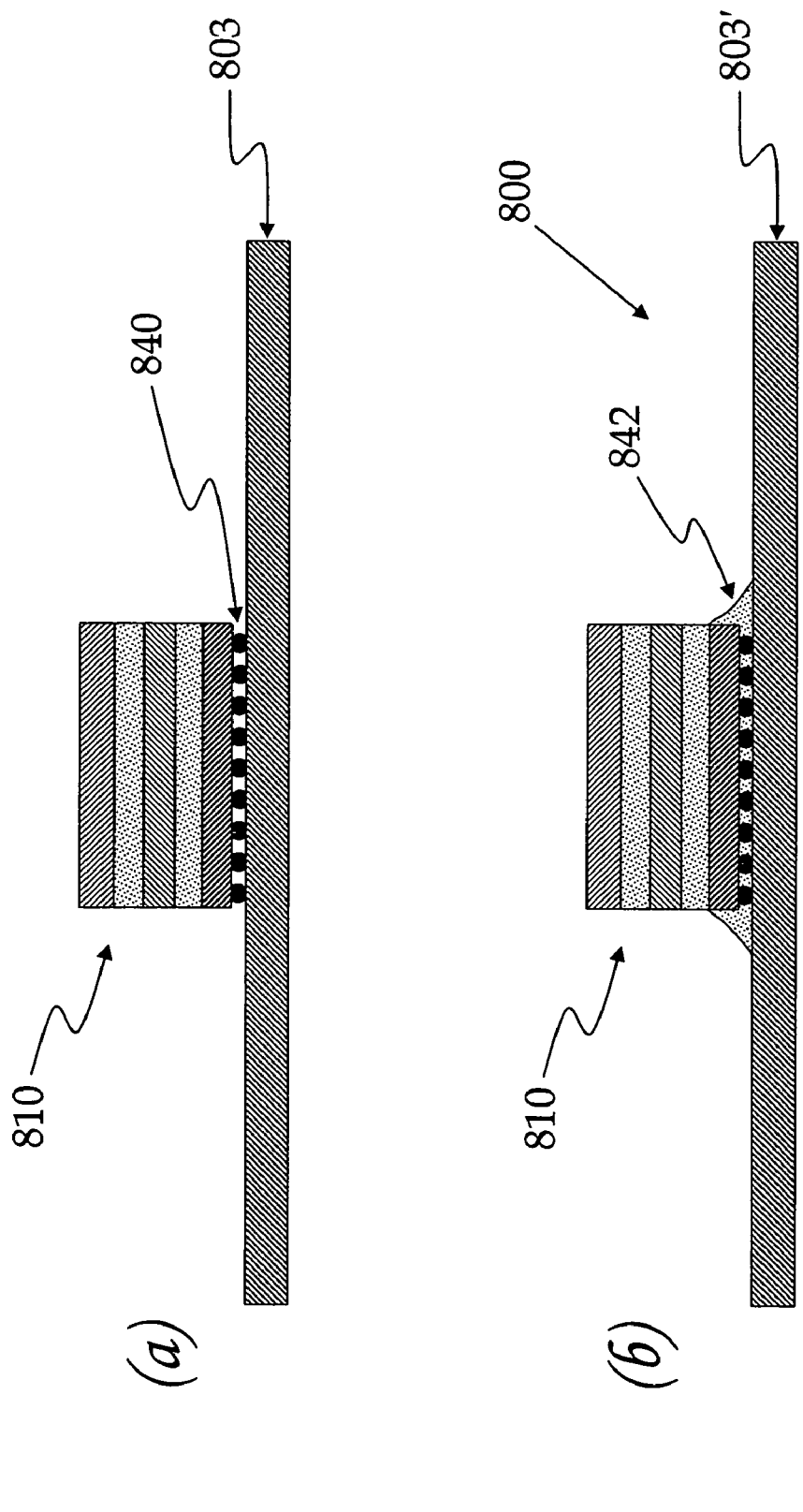
FIG. 8a depicts a cross-sectional view of an embodiment of a semiconductor device stack coupled with a package substrate.
FIG. 8b depicts a cross-sectional view of an embodiment of a semiconductor device stack coupled with a package substrate with an underfill material in the gap between the device stack and the package substrate.

A singulated semiconductor device stack 810, in embodiments such as shown in FIGS. 8a and 8b, is physically coupled with a substrate 803 by mechanically, adhesively, or other means. For example, a device stack 810 may be coupled with a substrate 803 using reflowed solder balls 840. Additionally, coupling may include electrical coupling, wherein an electrical path is formed, and an electrical current applied to one of a substrate 803 or a device stack 810 passes between the substrate 803 and the device stack 810. Substrate 803 may be a package substrate, and a semiconductor device stack 810 coupled with the substrate comprises a semiconductor device package 800.

Semiconductor device stack 810 is disposed adjacent to a substrate 803, and an underfill material is disposed adjacent to the semiconductor device stack 810 so that the underfill material migrates into and substantially fills a gap between the semiconductor device stack 810 and the substrate 803. The underfill material so disposed forms a fillet 842 between the substrate 803 and the semiconductor device stack 810 at one or more wafer portion edges of the stack 810. The fillet 842 contacts only a subset of the wafer portions of the stack 810, while the singulated edges of other wafer portions in the stack 810 remain exposed and uncontacted by the fillet 842.

Figure 9:
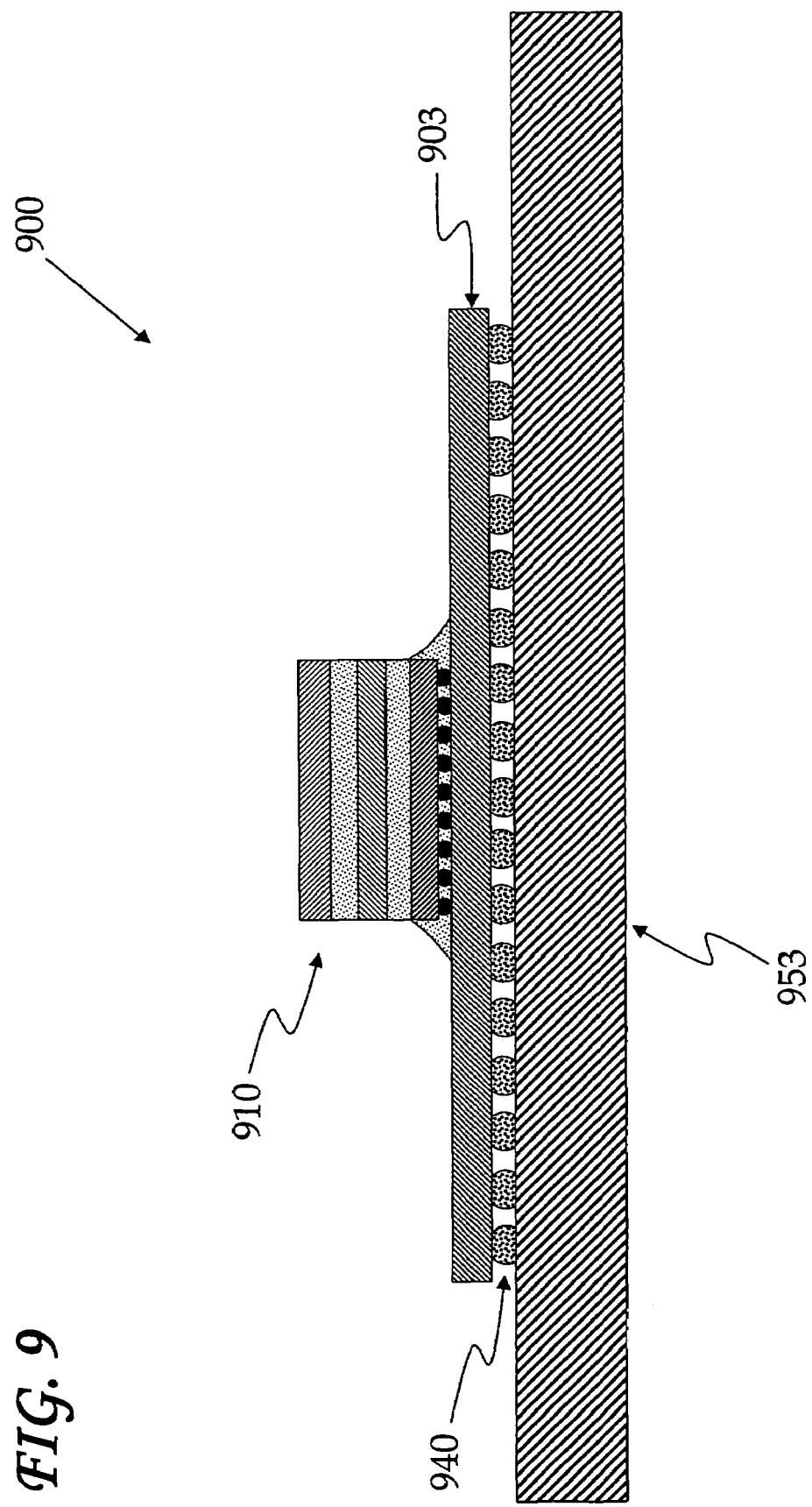
FIG. 9 depicts a cross-sectional view of an embodiment of a semiconductor device stacked package coupled with a substrate.

A semiconductor device package formed with a singulated semiconductor device stack 910 coupled with a package substrate 903 may further be coupled with another substrate 953, as seen in an embodiment shown in FIG. 9, including physical coupling, electrical coupling, or is both. In an exemplary embodiment, physical coupling is accomplished using reflowed solder balls 940 which can provide both physical and electrical coupling between the semiconductor device package and substrate 953. An exemplary embodiment of a second substrate is a computer motherboard, as can be used in any of a desktop personal computer, a mobile computer, or a server.

The semiconductor device stack coupled with a package substrate to form a semiconductor device package, the package further coupled with another substrate, or alternatively, a semiconductor device stack coupled with a substrate, forms a portion of an electronic device, for example, the motherboard of a stationary or mobile personal computer ('system'), or of an electronic media entertainment device, such as for a video, audio, or game playing device. Alternatively, the semiconductor device stack or device package is coupled with a printed circuit card to form an assembly for insertion into a receptacle on or in an electronic device. In general, a semiconductor device stack or device package is coupled with a substrate to form an assembly for use in virtually any electronic device wherein a semiconductor device provides a useful function for the electronic device. The assembly, including the semiconductor device stack, may be configured to be received into a housing of an electronic device, and retained either temporarily or more permanently within the device. Being 'permanently' retained does not mean that the assembly cannot be removed from the device, such as to allow repair or replacement, but simply that in normal usage, the assembly remains coupled with the device. An example would include a motherboard of a mobile personal computer system, which may be removed for repair or replacement, but is retained within the computer during normal use. An example of an assembly which is received and temporarily retained within a device includes a video game cartridge inserted into a game console (device) to play a game, but configured to be removable from the device when a user wants to play a different game.

If the assembly is retained either partially or entirely within a device, the assembly may be configured to receive electrical signals from another element of the electronic device, such as from an input/output (I/O) port, an electronic component on another substrate, a peripheral device connected to the electronic device, or others. A signal received by the assembly is then received by the device stack of the assembly to be acted upon in some way by a device of the device stack. Acting upon a signal includes such things as storing, processing, converting, attenuating, augmenting, or other such operations to modify the signal, or modify a condition of a device in the stack relative to a condition prior to receiving the signal. Likewise, a device stack may transmit a signal to an element of the electronic device to elicit a response to the signal, or to alter a condition of the element or of another element connected to the element, as compared to a condition prior to the transmission of the signal by the device stack. As with signals, an assembly may also receive power from an element or a circuit of a device, or alter a condition of the received power, such as by providing protection to the device against interruption of performance resulting from temporary discontinuities in power received from a power source.

In embodiments, a singulated semiconductor device stack may comprise a semiconductor device package not coupled with a package substrate. A power supply may be provided to the package, and/or signals may be transmitted from the package, received by the package, or both.

In various embodiments herein described, the term 'semiconductor device' is intentionally used in a broad sense to include devices used, for example, for memory, processing, graphics, audio, networking, communications, or any other function or device type which does or may structurally include a wafer portion. For example, a semiconductor device stack may include at least one wafer portion with the capability to perform memory functions, as well as another wafer portion with the capability to perform graphics processing functions. Alternate embodiments of this invention may include other combinations of wafer portions having capabilities for performing any of the functions that may be accomplished using devices formed at a surface of a wafer portion.

In various embodiments herein described, the term 'substrate' is intentionally used in a broad sense to include structures possessing a plane to which a semiconductor device stack is coupled, including printed circuit boards, flexible circuit substrates, organic substrates, or others used in the art.

In various embodiments herein described, the term 'wafer' is not limited to silicon wafers, but may include any material that may be formed to provide a substantially flat surface onto or into which features may be formed, and may be stacked and aligned as described. For example, in examplary embodiments, a wafer may be formed of germanium or of a ceramic material. In other embodiments, a wafer may be formed of a combination of materials. In still other embodiments, wafers may be superimposed to form a wafer stack wherein at least one of the wafers in the stack includes or is formed of a different material than at least one other wafer in the stack. However, the scope of materials from which wafers may be formed should not be construed as limited to those listed in these exemplary embodiments. Wafers according to various embodiments included herein may be relatively thick, such as to provide structural support, or may be relatively thin, such as to provide for a thinner overall semiconductor device stack, according to various objectives in an implementation of an embodiment. Particularly, embodiments of the invention provide stability to thinned wafers, which may be highly susceptible to damage during singulation and handling. Likewise, wafers used in embodiments need not necessarily be round, but may be otherwise shaped or truncated.

In various embodiments herein described, the term 'features' may refer to conductive features formed at a surface of a wafer. In other embodiments, a feature may be a visible artifact (e.g., a mark) at a surface of a wafer, whether connected with other features at the same surface or isolated, and whether conductive or not. In still other embodiments, a feature may include a localized change in a chemical composition at a surface of a wafer, or a localized change in a physical attribute at a surface of a wafer, such as thickness, roughness, grain size, or others.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

I claim:

1. A method of forming stacked semiconductor devices, comprising:
   forming an opening located about a center through a first wafer from a first substrate to a second surface;
   stacking the first wafer and a second wafer according to a bonding order, the second wafer superimposing the first wafer;
   securing the stack on a rotary table;
   rotating the stack; and
   dispensing underfill material through the opening and at a surface of the first wafer.

2. The method of claim 1, further comprising determining a wafer bonding order of the wafers.

3. The method of claim 1, wherein stacking the wafer further comprises aligning at least one reference point of each wafer in the stack with a reference point of another other wafer in the stack.

4. The method of claim 1, wherein the stack includes additional wafers superimposing the other wafer and each superimposing another, each superimposing wafer having a centrally located opening larger than that of the wafer superimposed.

5. The method of claim 1, wherein dispensing underfill material includes dispensing the underfill material at surfaces of a plurality of superimposed wafer simultaneously.

6. The method of claim 1, further comprising rotating the stack until the underfill material distributes between adjacent surfaces and proximate to the perimeter of at least two adjacent wafer in the stack.

7. The method of claim 1, further comprising heating the stack.

8. The method of claim 1, further comprising curing the dispensed underfill.

9. The method of claim 1, further comprising singulating stack wafer portions from the wafer stack.

* * * * *